United States Patent [19]

Hu

[11] Patent Number: 6,100,155

[45] Date of Patent: Aug. 8, 2000

[54] METAL-OXIDE-METAL CAPACITOR FOR ANALOG DEVICES

[75] Inventor: David Yu Hu, Singapore, Singapore

[73] Assignee: Chartered Semiconductor Manufacturing, Ltd., Singapore, Singapore

[21] Appl. No.: 09/151,201

[22] Filed: Sep. 10, 1998

[51] Int. Cl.[7] .................................................. H01L 21/20
[52] U.S. Cl. .......................................... 438/386; 438/253
[58] Field of Search .................................... 438/253, 255, 438/254, 381, 389, 386, 387, 398, 171, 190, 210

[56] References Cited

U.S. PATENT DOCUMENTS

| | | | |
|---|---|---|---|
| 5,479,316 | 12/1995 | Smrtic et al. | 361/322 |
| 5,576,240 | 11/1996 | Radosevich et al. | 437/60 |
| 5,589,416 | 12/1996 | Chittipeddi | 437/60 |
| 5,643,819 | 7/1997 | Tseng | 438/253 |
| 5,654,581 | 8/1997 | Radosevich et al. | 257/534 |
| 5,708,559 | 1/1998 | Brabazon et al. | 361/313 |
| 5,930,639 | 7/1999 | Schuele et al. | 438/396 |

Primary Examiner—David Nelms
Assistant Examiner—Dung A Le
Attorney, Agent, or Firm—George O. Saile; Rosemary L.S. Pike

[57] ABSTRACT

A method for fabricating a metal-oxide-metal capacitor is described. A first insulating layer is provided overlying a semiconductor substrate. A conducting line is formed on the surface of said first insulating layer to act as the node contact for the capacitor. A second insulating layer is deposited overlying the conducting line. The second insulating layer is etched through to form contact or via openings to the conducting line. The contact/via openings are filled with metal plugs wherein the metal plugs form the bottom plate electrode of the capacitor. The second insulating layer surrounding the metal plugs is etched into to form a trench for the capacitor. A capacitor dielectric layer is deposited over the surface of the second insulating layer and the metal plugs. A barrier metal layer is deposited overlying the capacitor dielectric layer. A metal layer is deposited overlying the barrier metal layer and patterned to form the upper plate electrode of the capacitor completing the fabrication of a metal-oxide-metal capacitor.

18 Claims, 6 Drawing Sheets

METAL-OXIDE-METAL CAPACITOR FOR ANALOG DEVICES

BACKGROUND OF THE INVENTION

(1) Field of the Invention

The present invention relates to a method of fabricating a metal-oxide-metal capacitor, and more particularly, to a method of forming an improved metal-oxide-metal capacitor in the fabrication of an integrated circuit device.

(2) Description of the Prior Art

Capacitors are critical components in the integrated circuit devices of today. For example, in analog integrated circuit devices, capacitors play an important role. Both polysilicon and metal-oxide-metal capacitors have been used in the art. Metal-oxide-metal (MOM) capacitors can be used at multiple levels and in contacts or vias. Polysilicon capacitors require complex or special processes. They have problems such as a lack of flexibility, metal interference, and dopant diffusive effect, among others.

U.S. Pat. Nos. 5,576,240 and 5,654,581 to Radosevich et al, U.S. Pat. No. 5,479,316 to Smrtic et al, and U.S. Pat. No. 5,708,559 to Brabazon all disclose various methods of forming metal-oxide-metal capacitors. U.S. Pat. No. 5,589,416 to Chittipeddi teaches fabrication of a metal-oxide-polysilicon capacitor.

SUMMARY OF THE INVENTION

Accordingly, it is a primary object of the invention to provide an effective and very manufacturable process for producing a metal-oxide-metal capacitor.

Another object of the present invention is to provide a method for fabricating a metal-oxide-metal capacitor with good step coverage and uniformity.

In accordance with the objects of this invention, a method for fabricating a metal-oxide-metal capacitor is achieved. A first insulating layer is provided overlying a semiconductor substrate. A metal line is formed on the surface of the first insulating layer to act as the node contact for the capacitor. A second insulating layer is deposited overlying the metal line. The second insulating layer is etched through to form via openings to the metal line. The via openings are filled with metal plugs wherein the metal plugs form the bottom plate electrode of the capacitor. The second insulating layer surrounding the metal plugs is etched into so that the metal plugs protrude from the surface of the second insulating layer. A capacitor dielectric layer is deposited over the surface of the second insulating layer and the metal plugs. A barrier metal layer is deposited overlying the capacitor dielectric layer. A metal layer is deposited overlying the barrier metal layer and patterned to form the upper plate electrode of the capacitor completing the fabrication of a metal-oxide-metal capacitor.

Also in accordance with the objectives of the invention, a metal-oxide-metal capacitor is achieved. The metal-oxide-metal capacitor comprises a metal contact node on a first insulating layer overlying a semiconductor substrate, a bottom plate electrode comprising metal plugs extending through a second insulating layer to contact the node contact, a capacitor dielectric layer overlying the second insulating layer and metal plugs, a barrier metal layer overlying the capacitor dielectric layer, and a metal layer overlying the capacitor dielectric layer wherein the metal layer forms the upper electrode of the capacitor.

BRIEF DESCRIPTION OF THE DRAWINGS

In the following drawings forming a material part of this description, there is shown.

DESCRIPTION OF THE PREFERRED EMBODIMENTS

Figure 1:
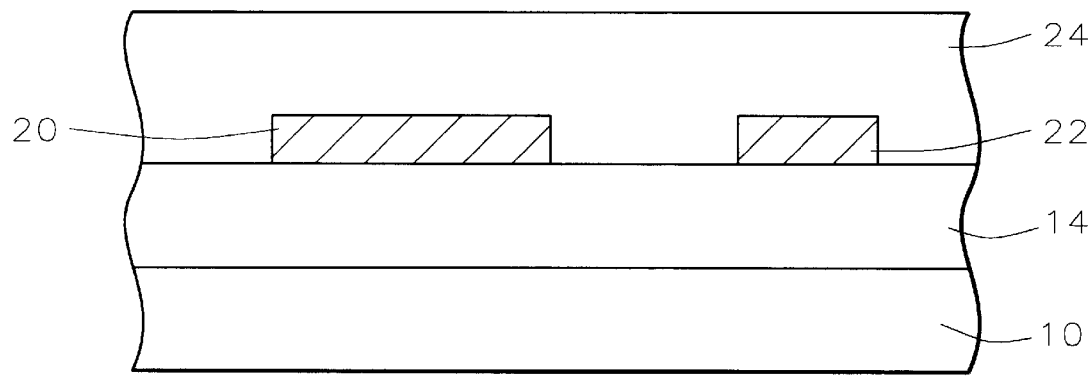
FIGS. 1 through 12 are schematic cross-sectional representations of a preferred embodiment of the present invention.

Referring now more particularly to FIG. 1, there is shown a partially completed integrated circuit device. The semiconductor substrate 10 is preferably composed of silicon having a (100) crystallographic orientation. Semiconductor device structures are formed in and on the semiconductor substrate. These may include gate electrodes and interconnection lines and associated source and drain regions. The semiconductor device structures, not shown, may be formed in layer 14 and covered with an insulating layer. Next, metal lines 20 and 22 are formed as is conventional in the art. Alternatively, these lines 20 and 22 could be polysilicon. A thick insulating layer, such as chemically vapor deposited (CVD) silicon dioxide, phosphosilicate glass (PSG), or the like, 24 is deposited over the lines 20 and 22 and then planarized, for example by chemical mechanical polishing (CMP), to obtain a flat surface.

Figure 2:
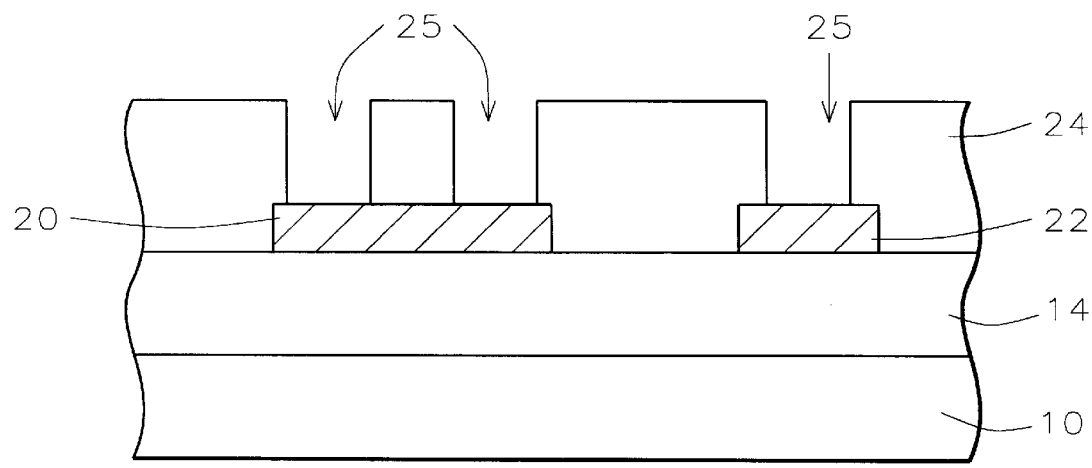

Referring now to FIG. 2, using conventional lithographic and etching techniques, via or contact openings 25 are made through the insulating layer 22 to the metal or polysilicon lines 20 and 22. The line 20 will form the node contact of the capacitor. An array of contact or via openings is preferred, but any number of openings may be made to the line 20.

Figure 3:
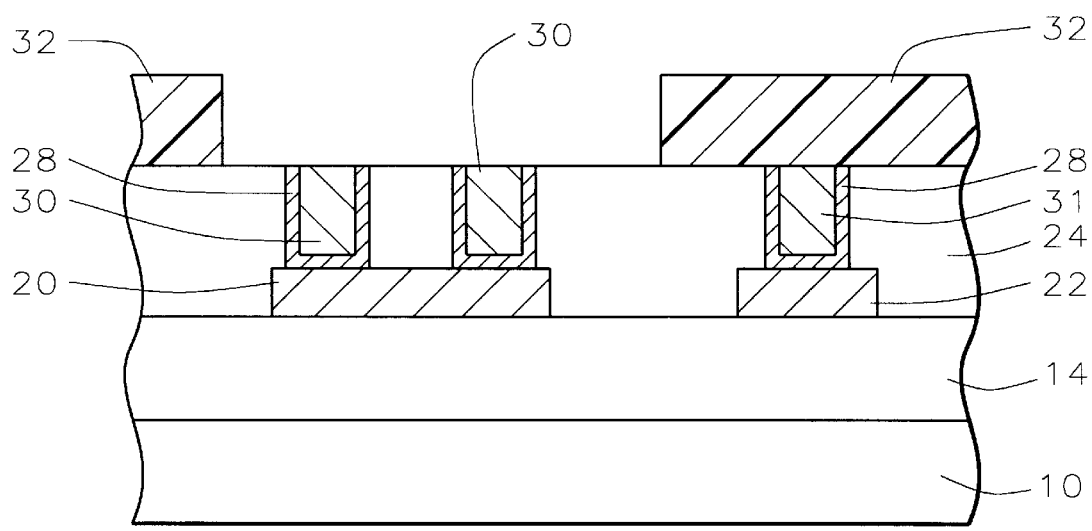

Referring now to FIG. 3, the contact/via openings 25 are filled with a barrier metal 28, such as titanium nitride, and a metal layer, such as tungsten, which is planarized by CMP to leave tungsten plugs 30 and 31.

A layer of photoresist is coated over the surface of the substrate and patterned to form the photoresist mask 32 exposing only the metal plugs which will form the capacitor.

Figure 4:
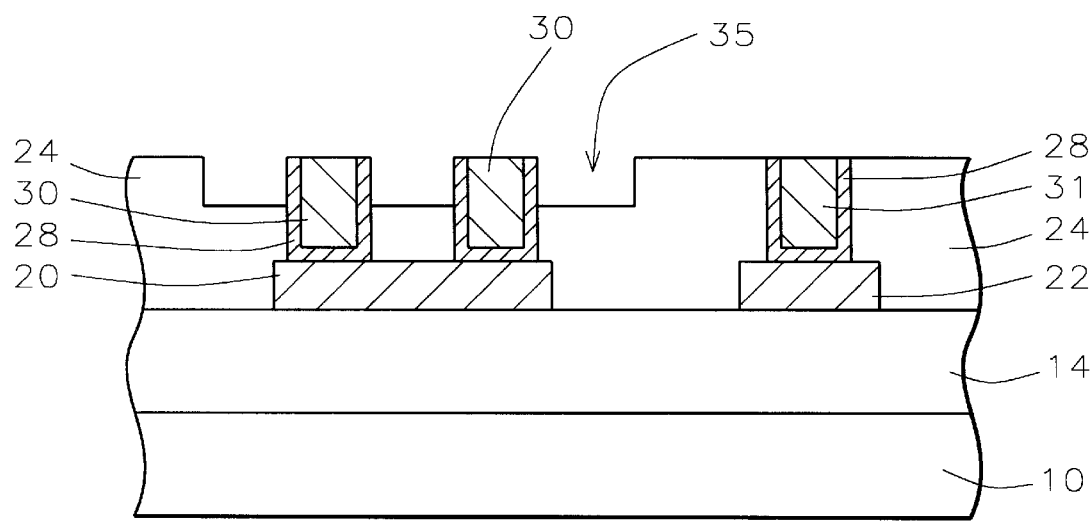

Referring now to FIG. 4, the insulating layer 24 is etched away where it is not covered by the photoresist mask 32 using an oxide buff. The oxide buff is a light etch using a reactive ion etch (RIE) which removes a portion of the oxide surrounding the metal plugs leaving a trench 35 around the metal plugs 30. The RIE does not etch away the metal plugs 30. The photoresist is removed, as shown in FIG. 4. The metal plugs 30 will form the bottom plate electrode of the capacitor.

Figure 5:
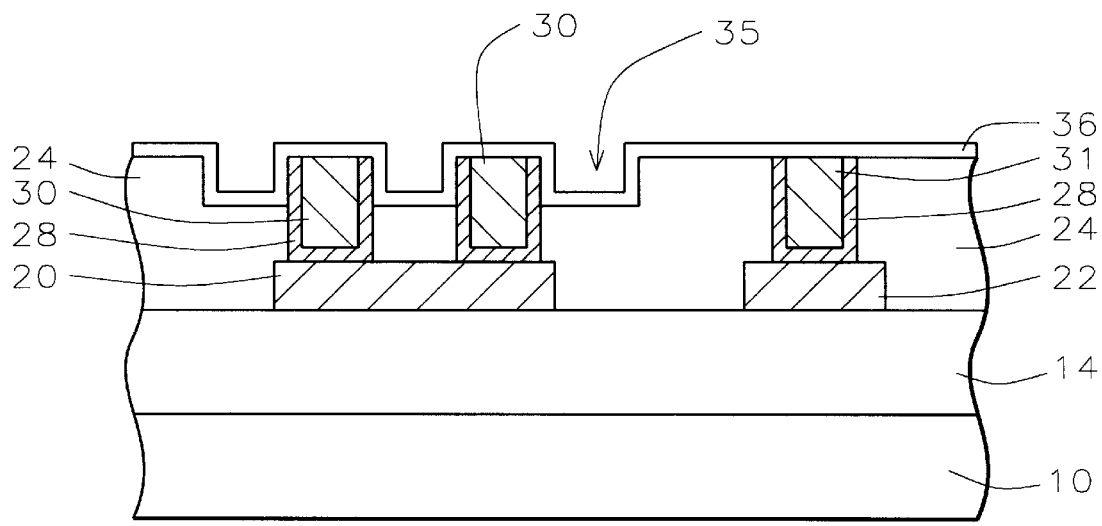

Referring now to FIG. 5, a capacitor dielectric layer 36 is deposited conformally over the surface of the substrate and within the trench. This layer may comprise undoped silicate glass (USG), or any other suitable dielectric, having a thickness of between about 200 and 1500 Angstroms. The dielectric layer should be as thin as possible.

Figure 6:
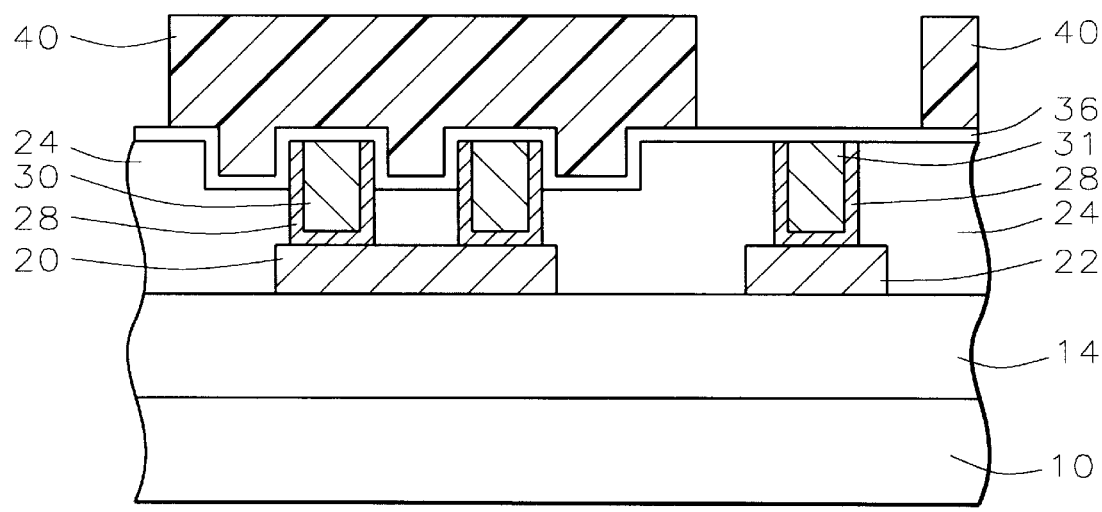

A second photoresist mask 40 is formed over the substrate to protect the capacitor structure and having an opening over the metal plug 31 not in the capacitor area, as illustrated in FIG. 6.

Figure 7:
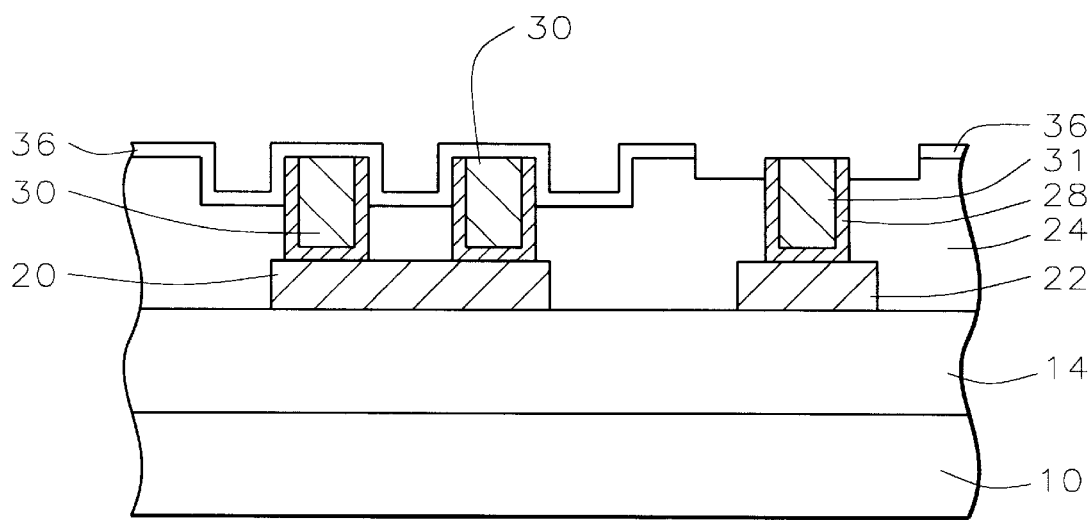

Referring now to FIG. 7, the USG layer 36 is etched away over the tungsten plug 31. A top portion of the insulating layer 24 around this tungsten plug is also etched away. The photoresist mask 40 is stripped.

Figure 8:
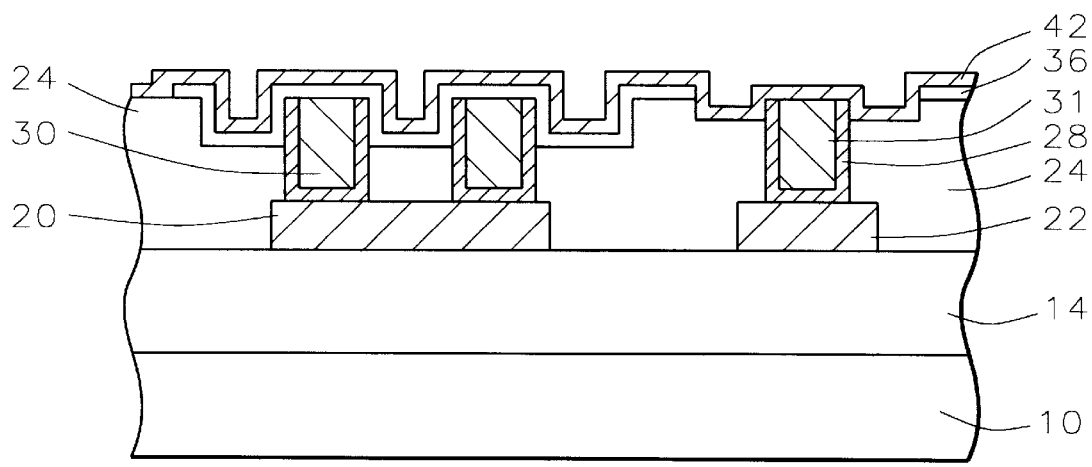

Referring now to FIG. 8, a barrier metal layer 42 is deposited over the surface of the insulating layer and over the USG layer 36. The barrier metal layer may comprise titanium and titanium nitride having a combined thickness of between about 50 and 600 Angstroms. The barrier metal layer will prevent the overlying metal layer from penetrating the capacitor dielectric layer and provides adhesion between the overlying metal layer and the metal plug.

Figure 9:
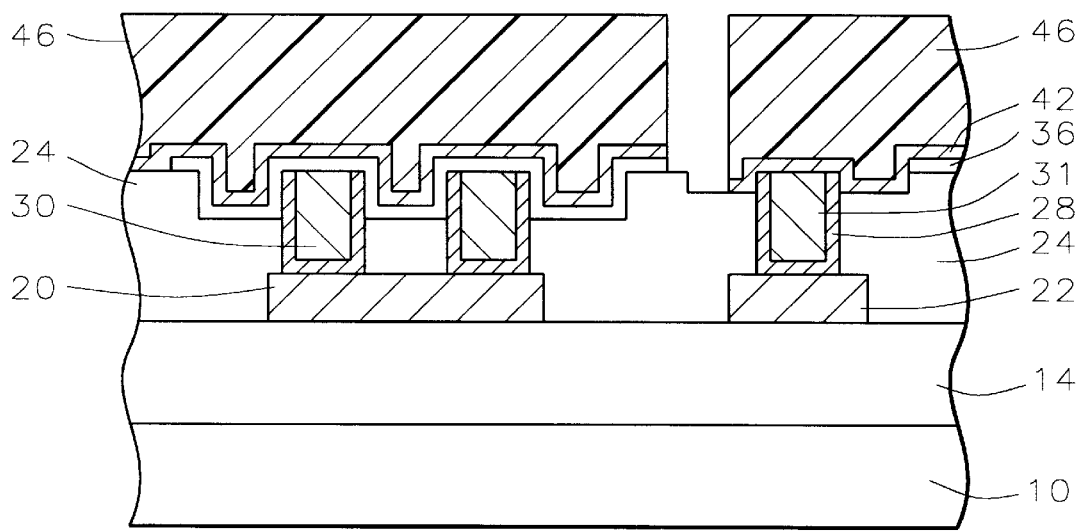
Figure 10:
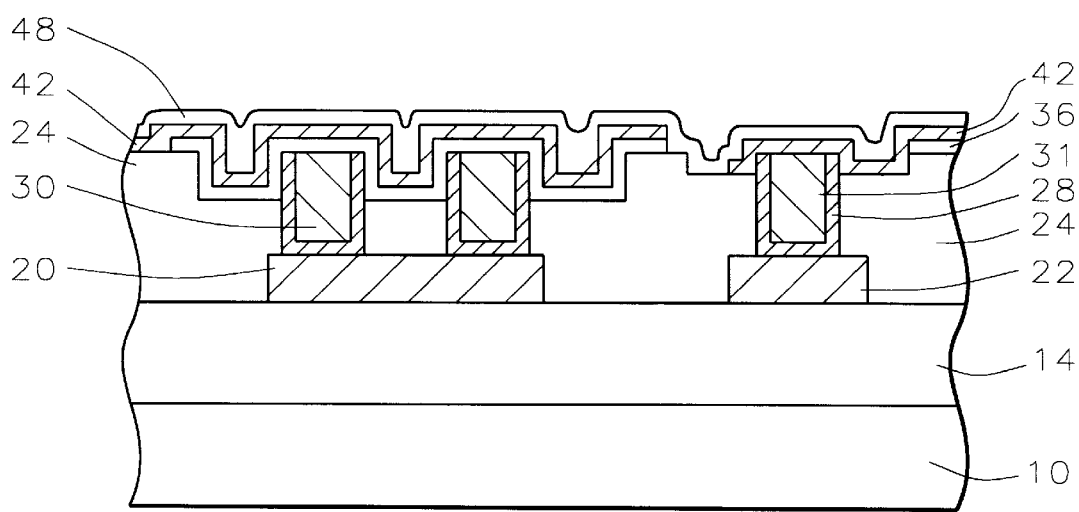
Figure 11:
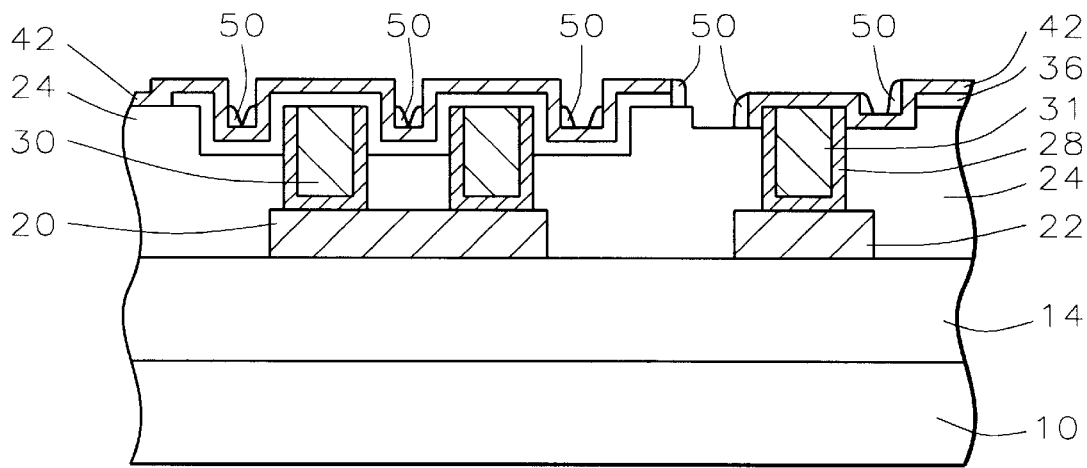

FIGS. 9 through 11 illustrate an optional series of steps to form spacers to secure the leakage path. Referring to FIG. 9, a photoresist mask 46 is formed over the surface of the substrate to expose the area of leakage concern near the metal plug 31. The barrier metal layer 42 in that are is etched away, as shown in FIG. 10. The photoresist mask is removed and a thin oxide layer 48 is deposited over the surface of the substrate. The thin oxide layer is etched back to form spacers 50, illustrated in FIG. 11, on the sidewalls of the titanium nitride layer and within small openings, as shown. The spacers will prevent leakage especially around the metal plug 31. The spacers will not be shown in the subsequent figures, but it should be understood that they may be there.

Figure 12:
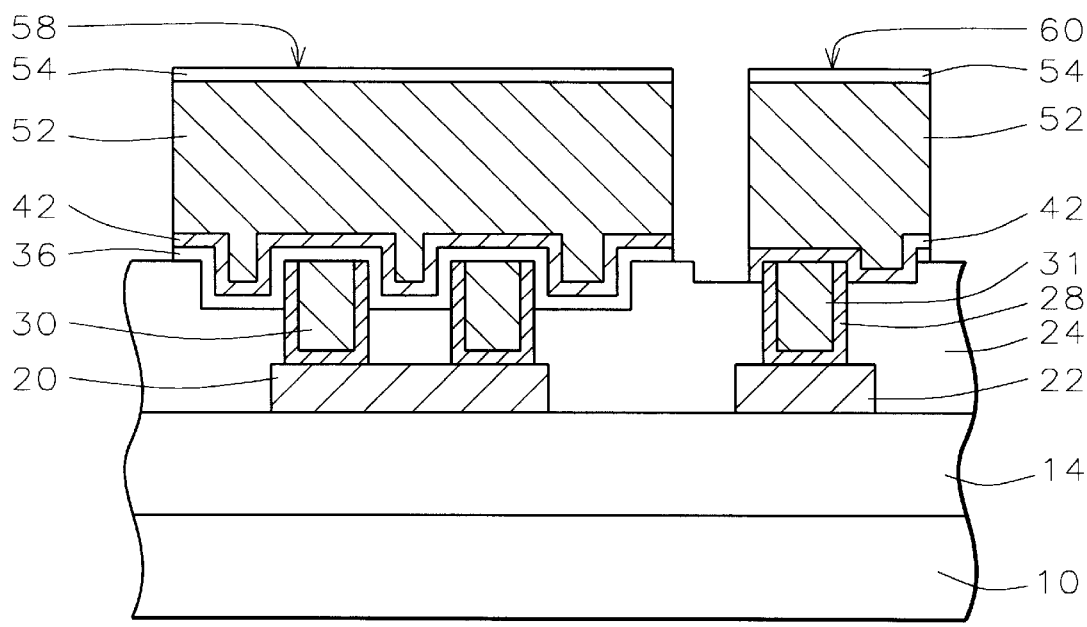

Referring now to FIG. 12, the metal layer 52 is deposited over the barrier metal layer 42 to a thickness of between about 3000 and 8000 Angstroms. This metal layer may be aluminum such as AlCu. The metal layer and barrier metal layer, 52 and 42, respectively, are etched away where they are not covered by a mask, not shown, to form the top plate electrode of the capacitor 58 and a metal contact 60. An anti-reflective coating (ARC) layer 54 may be deposited before the metal layer is patterned.

FIGS. 1 through 12 illustrate the method and resulting capacitor of one technique in the spirit of the present invention. It should be understood that while the metal 20 and 22 is shown in the method of FIGS. 1–12 as a first level metal, this layer could be at a higher level in the overall structure.

The process of the invention results in the fabrication of a metal-oxide-metal capacitor. The metal plug process of the invention is a simple process, having good step coverage and uniformity. The process can be used on a via or a contact structure. The etching away of a trench around the metal plugs provides for a larger capacitor area.

The metal-oxide-metal capacitor of the present invention will be described with reference to FIG. 12. The metal-oxide-metal capacitor comprises a metal or polysilicon contact node 20 on a first insulating layer 14 overlying a semiconductor substrate 10, a bottom plate electrode comprising metal plugs 30 extending through a second insulating layer 24 to contact the node contact 20, a capacitor dielectric layer 36 overlying the second insulating layer 24 and metal plugs 30, a barrier metal layer 42 overlying the capacitor dielectric layer 36, and a metal layer 52 overlying the capacitor dielectric layer wherein the metal layer forms the upper electrode of the capacitor 58. A guard ring, not shown, connected to ground or the like, should be used around the capacitor structure as is understood by workers in the field. It should be understood that insulator layer 14 may cover semiconductor device structures, not shown, which may include gate electrodes, source and drain regions, and underlying levels of metal interconnections.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a metal-oxide-metal capacitor comprising:

providing a first insulating layer overlying a semiconductor substrate;

forming a conducting line on the surface of said first insulating layer;

depositing a second insulating layer overlying said conducting line;

etching through said second insulating layer to form contact/via openings to said conducting line;

filling said contact/via openings with metal plugs wherein said metal plugs form the bottom plate electrode of said capacitor;

etching into said second insulating layer surrounding said metal plugs so that said metal plugs protrude from said second insulating layer wherein a trench is formed surrounding said metal plugs;

thereafter depositing a capacitor dielectric layer over the surface of said second insulating layer and said metal plugs;

depositing a barrier metal layer overlying said capacitor dielectric layer; and depositing a metal layer overlying said barrier metal layer and patterning said metal layer and said barrier metal layer wherein said metal layer forms the upper plate electrode of said capacitor completing said fabrication of said metal-oxide-metal capacitor.

2. The method according to claim 1 wherein said semiconductor substrate includes semiconductor device structures such as gate electrodes and source and drain regions.

3. The method according to claim 1 wherein said semiconductor substrate includes semiconductor device structures such as gate electrodes and source and drain regions and multiple levels of metal interconnections.

4. The method according to claim 1 wherein said conducting line comprises the node contact for said capacitor.

5. The method according to claim 1 wherein said conducting line comprises metal.

6. The method according to claim 1 wherein said conducting line comprises polysilicon.

7. The method according to claim 1 wherein said capacitor dielectric layer comprises undoped silicate glass having a thickness of between about 200 and 1500 Angstroms.

8. The method according to claim 1 wherein said barrier metal layer comprises titanium/titanium nitride having a combined thickness of between about 50 and 600 Angstroms.

9. The method according to claim 1 wherein said metal layer comprises AlCu having a thickness of between about 3000 and 8000 Angstroms.

10. A method for fabricating a metal-oxide-metal capacitor and a metal contact comprising:

providing a first insulating layer overlying a semiconductor substrate;

forming conducting lines on the surface of said first insulating layer;

depositing a second insulating layer overlying said conducting lines;

etching through said second insulating layer to form contact/via openings to said conducting lines;

filling said contact/via openings with metal plugs wherein said metal plugs form the bottom plate electrode of said capacitor and wherein one of said metal plugs forms the bottom portion of a metal contact;

etching into said second insulating layer surrounding said metal plugs that will form said bottom plate electrode so that said metal plugs that will form said bottom plate electrode protrude from said second insulating layer wherein a trench is formed surrounding said metal plugs that will form said bottom plate electrode;

thereafter depositing a capacitor dielectric layer over the surface of said second insulating layer and said metal plugs;

etching away said second insulting layer overlying said metal plug that will form said bottom portion of said metal contact;

depositing a barrier metal layer overlying said capacitor dielectric layer and said bottom portion of said metal contact;

etching away said barrier metal layer adjacent to said bottom portion of said metal contact;

thereafter depositing a third insulating layer overlying said barrier metal layer and said bottom portion of said metal contact;

etching away said third insulating layer to leave spacers on the sidewalls of said barrier metal layer adjacent to said bottom portion of said metal contact where said spacers will prevent the formation of a leakage path adjacent to said bottom portion of said metal contact; and depositing a metal layer overlying said barrier metal layer and said bottom portion of said metal contact and patterning said metal layer and said barrier metal layer wherein said metal layer forms the upper plate electrode of said capacitor and forms the top portion of said metal contact completing said fabrication of said metal-oxide-metal capacitor.

11. The method according to claim 10 wherein said semiconductor substrate includes semiconductor device structures such as gate electrodes and source and drain regions.

12. The method according to claim 10 wherein said semiconductor substrate includes semiconductor device structures such as gate electrodes and source and drain regions and multiple levels of metal interconnections.

13. The method according to claim 10 wherein one of said conducting lines comprises the node contact for said capacitor and another of said conducting lines comprises a node for said metal contact.

14. The method according to claim 10 wherein said conducting lines comprise metal.

15. The method according to claim 10 wherein said conducting lines comprise polysilicon.

16. The method according to claim 10 wherein said capacitor dielectric layer comprises undoped silicate glass having a thickness of between about 200 and 1500 Angstroms.

17. The method according to claim 10 wherein said barrier metal layer comprises titanium/titanium nitride having a combined thickness of between about 50 and 600 Angstroms.

18. The method according to claim 10 wherein said metal layer comprises AlCu having a thickness of between about 3000 and 8000 Angstroms.

* * * * *